United States Patent [19]

Cloup

[11] 4,359,704
[45] Nov. 16, 1982

[54] DEVICE FOR SETTING UP CONTACT CONNECTIONS BETWEEN INDEPENDENT ELECTRICAL CIRCUITS

[75] Inventor: Philippe Cloup, Latresne, France

[73] Assignee: Editions Edmond Dujardin, La Teste de Buch, France

[21] Appl. No.: 46,562

[22] Filed: Jun. 7, 1979

[51] Int. Cl.³ ............................................. H01H 36/00
[52] U.S. Cl. .................................. 335/205; 335/199;
                                                    335/196
[58] Field of Search .................... 335/205, 199, 196

[56] References Cited

U.S. PATENT DOCUMENTS

| 3,739,117 | 6/1973 | Melton | 200/61.1 |
| 3,786,391 | 1/1974 | Mathauser | 335/205 |
| 3,898,595 | 8/1975 | Launt | 335/199 |
| 3,916,360 | 10/1975 | Pedersen et al. | 335/205 |
| 4,068,202 | 1/1978 | Lyons | 335/205 |

FOREIGN PATENT DOCUMENTS 1572902 5/1969 France .
2226744 11/1974 France .
2325172 9/1976 France .

OTHER PUBLICATIONS

IBM Technical Disclosure Bullentin vol. 8, No. 1, Jun. 1965, H. Funk & Levitre.

Primary Examiner—Harold Broome
Attorney, Agent, or Firm—Weingarten, Schurgin & Gagnebin

[57] ABSTRACT

A device for setting up a contact connection between independent electrical circuits, which comprises a plate made of magnetic material 1 on which is placed a sheet 2 of insulating material, supporting at least two independent conductor circuits 3, 4 adapted to be connected together by means of a magnetized conductive member 6, held in position by the attraction of the said magnetic plate 1.

The invention relates to a device used in games and in the audio-visual field.

3 Claims, 2 Drawing Figures

DEVICE FOR SETTING UP CONTACT CONNECTIONS BETWEEN INDEPENDENT ELECTRICAL CIRCUITS

The present invention relates to a device for setting up contact connections between independent electrical circuits.

In certain devices used for example in games and in the audio-visual field, several independent electrical circuits are provided which are adapted to be connected temporarily by contact, in order to combine the said circuits in different ways for specific purposes.

According to the present invention, the device comprises a plate made of a magnetic material on which is placed a sheet of insulation material supporting at least two independent conductor circuits, adapted to be connected together by a magnetized member, held in position by the attraction of the said magnetic plate.

According to another characteristic of the invention, the conductive member is composed of a magnet made of insulating material coated with a layer of conducting material.

This arrangement ensures an excellent contact when the parts to be connected are not perfectly plane.

Furthermore, this arrangement makes it possible whenever an insulating layer is used on the circuit which presents orifices opposite the contact areas, to make up for any level differences.

Such an embodiment with ferrite magnets (non-conductive) gives contact members which are inexpensive, mechanically reliable and oxidation-free.

Other characteristics and advantages of the invention will be more readily understood on reading the following description of several embodiments thereof, reference being made to the accompanying drawings.

Figure 1:
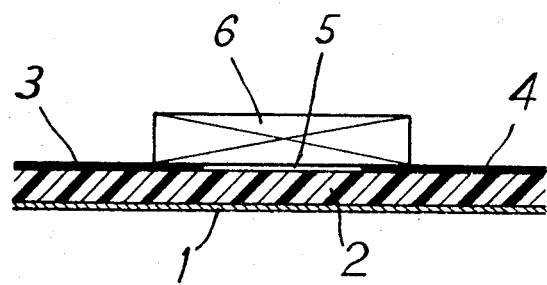
FIG. 1 is an elevational and cross-sectional view of an embodiment of the contact connection device according to the invention.

FIG. 1 shows a device for setting up contact connections between two circuits, comprising a plate 1 made of a magnetic material such as sheet metal on which is placed a sheet 2 of insulating material carrying two conductors 3, 4 which belong respectively to two different electrical circuits. Conductors 3 and 4 may be produced for example according to the printed circuit method. For electrically connecting the conductors 3 and 4 which are separated by a non-conductive space 5, a magnetized conductive member 6 is used, and held in position by the magnetic attraction of the magnetic plate 1.

In the embodiment shown in FIG. 1, the conductive member 6 which is used is constituted by a conductive magnet.

Figure 2:
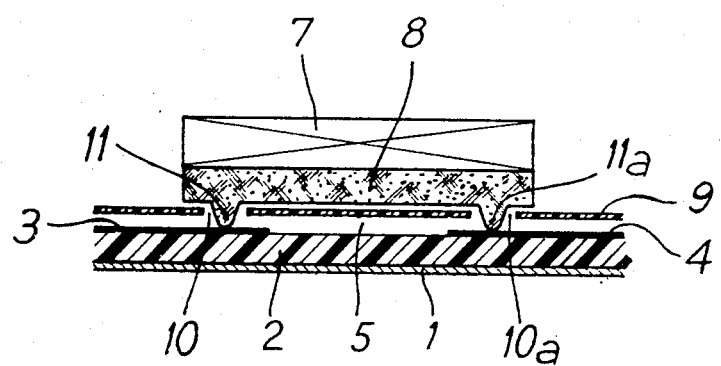
FIG. 2 is a cross-sectional view of another embodiment of the contact connection device according to the invention.

FIG. 2 shows a variant embodiment wherein the conductive member is constituted by a non-conductive magnet 7, in ferrite for example, on which a conductive foam layer 8 is fixed in known manner, said layer being in contact with the conductors 3 and 4. The conductive foam may be polyurethane foam containing colloidal graphite.

It is also possible, as shown in FIG. 2 to place above the conductors 3, 4 of the electrical circuits, a layer of insulating material 9 concealing the said circuits and having orifices 10, 10a situated opposite the contact areas of the conductors 3 and 4.

In such a case, the foam layer 8 can be provided with bosses 11, 11a adapted to fit through the orifices 10, 10a to come into contact with the conductors 3 and 4 under the effect of the magnetic attraction of the plate 1 on the magnet 7.

Other modifications may of course by brought by any one skilled in the art to the devices or methods described hereinabove by way of example and non-restrictively, without departing from the scope of the invention.

What is claimed is:

1. A device for making electrical interconnection between independent electrical circuits, said device comprising:

a support sheet of electrically insulating material;

a plurality of independent electrically conductive circuit paths disposed on one surface of said support sheet, each of said circuit paths having contact areas thereon;

a continuous plate of material to which magnets are attracted disposed on the opposite surface of said support sheet, said plate being coextensive with the area of said one surface upon which said circuit paths reside;

a layer of insulating material disposed on top of said circuit paths on said one surface of said support sheet, said layer of insulating material having orifices disposed opposite said contact areas of said circuit paths; and electrically conductive magnetic means coupled to said support sheet adjacent said one surface thereof by the magnetic attraction between said magnetic means and said plate and being movable to selectively interconnect contact areas of at least two of said circuit paths on said one side of said support sheet, said magnetic means having bosses projecting therefrom adapted to extend through said orifices in said layer of insulating material to contact said contact areas of said circuit paths.

2. A device as claimed in claim 1 wherein said circuit paths are printed on said support sheet.

3. A device for making electrical interconnection between independent electrical circuits, said device comprising:

a support sheet of electrically insulating material;

a plurality of independent electrically conductive circuit paths disposed on one surface of said support sheet, each of said circuit paths having contact areas thereon;

a continuous plate of material to which magnets are attracted disposed on the opposite surface of said support sheet, said plate being coextensive with the area of said one surface upon which said contact paths reside;

a layer of insulating material disposed on top of said circuit paths on said one surface of said support sheet, said layer of insulating material having orifices disposed opposite said contact areas of said circuit paths; and electrically conductive magnetic means coupled to said support sheet adjacent said one surface thereof by the magnetic attraction between said magnetic means and said plate and being movable to selectively interconnect contact areas through said orifices of at least two of said circuit paths on said one side of said support sheet, said magnetic means being retained in any position in which it is placed on said support sheet by the magnetic attraction between said magnetic means and said plate.

* * * * *